US005483857A

United States Patent [19]
Ziberna

[11] Patent Number: 5,483,857
[45] Date of Patent: Jan. 16, 1996

[54] WORKPIECE FINISHING AND PRESENTATION MACHINE

[75] Inventor: Frank Ziberna, Elmhurst, Ill.

[73] Assignee: Bi-Link Metal Specialties, Elmhurst, Ill.

[21] Appl. No.: 123,718

[22] Filed: Sep. 20, 1993

[51] Int. Cl.⁶ .............................. B21D 28/02; B26D 7/18
[52] U.S. Cl. .................. 83/104; 83/109; 83/153; 83/165; 83/277; 83/945
[58] Field of Search .......................... 83/104, 111, 150, 83/151, 153, 165, 277, 914, 945, 949, 109; 29/413, 414

[56] References Cited

U.S. PATENT DOCUMENTS

| | | | |
|---|---|---|---|
| 880,085 | 2/1908 | Lindsey | 83/162 |
| 3,448,645 | 6/1969 | Graf et al. | |
| 3,461,756 | 8/1969 | Mojonnier | 83/17 |
| 3,461,761 | 8/1969 | Mojonnier | 83/140 |
| 3,512,438 | 5/1970 | Burdge | 83/209 |
| 3,839,935 | 10/1974 | Daniels | 83/165 X |
| 4,261,238 | 4/1981 | Scribner | 83/225 |
| 4,272,812 | 6/1981 | Svensson | 83/277 X |
| 4,277,997 | 7/1981 | Scribner | 83/225 |
| 4,349,310 | 9/1982 | Schneider et al. | |
| 4,583,436 | 4/1986 | Asano | 83/104 |
| 4,633,745 | 1/1987 | Asano | 83/455 |
| 4,683,789 | 8/1987 | Lopez | 83/277 X |
| 4,737,331 | 4/1988 | Moore | 83/277 X |
| 4,914,996 | 4/1990 | Lavorel | 83/151 |
| 5,241,740 | 9/1993 | Kettler | 83/165 X |

FOREIGN PATENT DOCUMENTS 1540558  2/1979  United Kingdom.
2025273  1/1980  United Kingdom.

Primary Examiner—Eugenia Jones
Attorney, Agent, or Firm—Lockwood, Alex, Fitzgibbon & Cummings

[57] ABSTRACT

A workpiece finishing machine feeds a plurality of interconnected workpieces, in the form of a feedstock bandolier, to a cutting cylinder wherein individual workpieces are separated from the bandolier by a cutting punch. The separated workpiece is subsequently moved into engagement with a reciprocating presentation carriage which removes the workpiece from the cutting cylinder and presents it in a predetermined position to a robotic loader or assembly device. The machine includes a plurality of sensors which detect various aspects of the feedstock and workpiece.

22 Claims, 4 Drawing Sheets

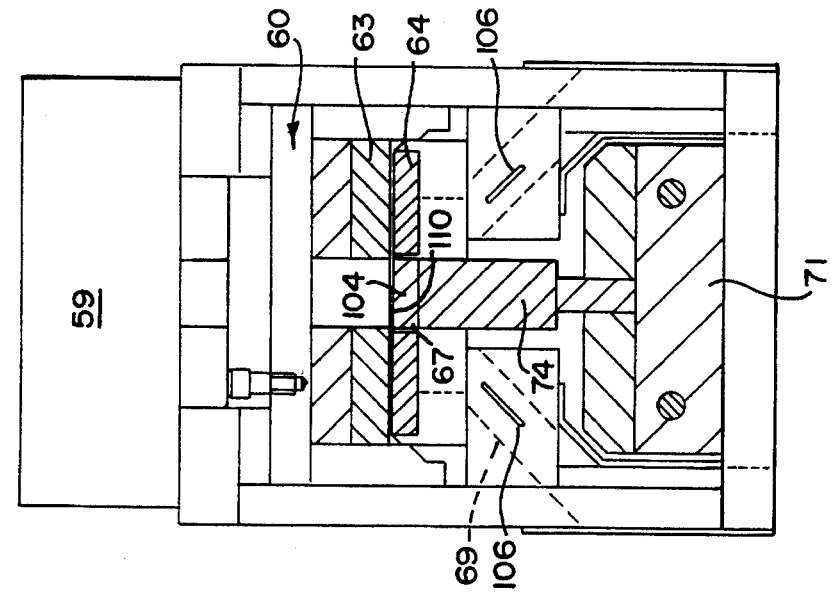
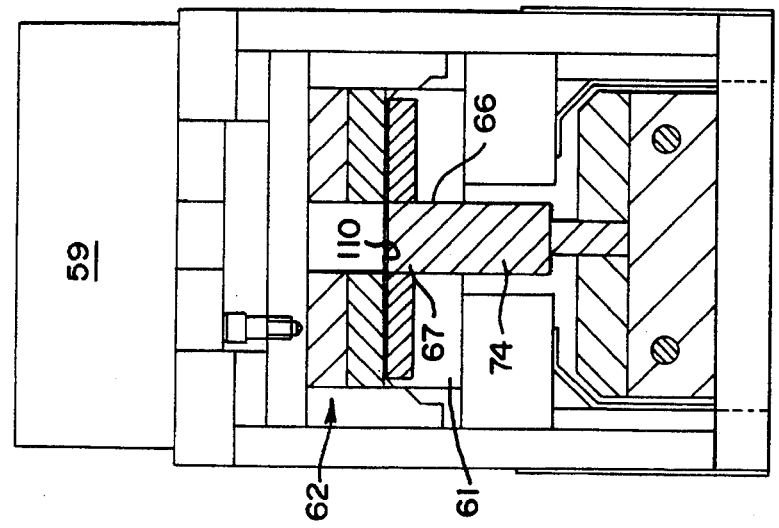
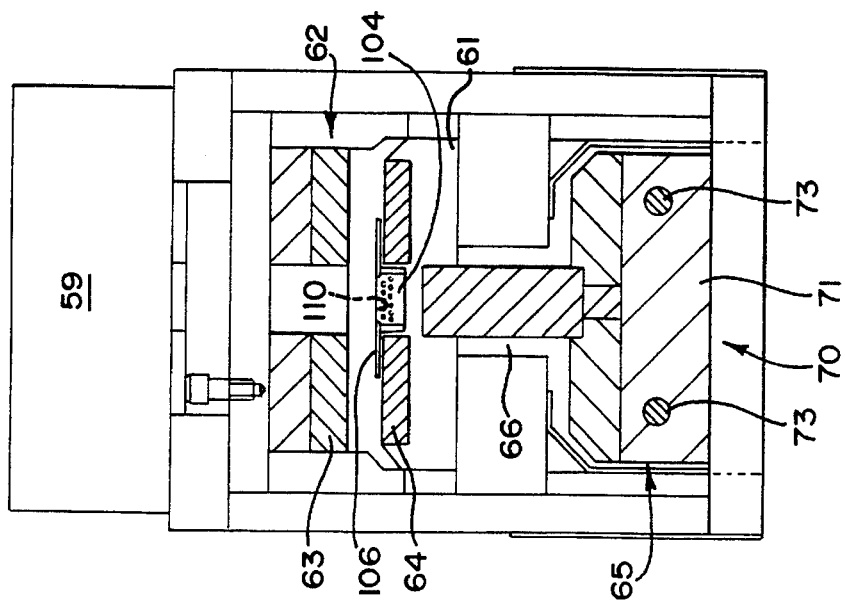

WORKPIECE FINISHING AND PRESENTATION MACHINE

BACKGROUND AND SUMMARY OF THE INVENTION

The present invention generally relates to workpiece finishing and presentation machines, and more particularly, to such machines which successively trim individual workpieces from a supply means of interconnected workpieces wherein the separated workpiece is subsequently presented to an automated loading means.

Many machines for finishing workpieces such as for trimming workpieces from a supply of workpieces are known. These machines include conventional punch presses in which reciprocating cutting punch or die sequentially contacts a supply feedstock to separate a workpiece therefrom. Other machines may include trimming machines which trim an individual part or workpiece from a connecting member interconnecting a plurality of such workpieces, such as a strip or other carrier item. In these machines, the supply feedstock may consist of a coil of sheet metal in which individual workpieces have been previously stamped and formed. Yet other machines, such as that described in U.S. Pat. No. 3,512,438 utilize a strip of feedstock which is fed into the punch press and acted upon thereby to form the feedstock into a predetermined configuration in its entire length. Individual workpieces are subsequently trimmed from the feedstock as a further finishing step.

In the manufacture of a variety of electronic components and other components, robotic loaders or other automated assembly devices are used more frequently to achieve better production line efficiencies. Such automated assembly devices pick up individual parts or workpieces from a predesignated location and inserts the part into a portion of the component. Such automated assembly devices are commonly used in the construction of electronic circuit boards. These automated devices may include, for example, an arm which moves along a designated path to a predesignated location where the arm picks up an individual workpiece and inserts it in place onto a production line component, such as a circuit board, where it is subsequently soldered or otherwise attached thereto by another automated device. In order to maintain production line efficiencies, the robotic devices need to have individual workpieces consistently presented to them in a predesignated orientation and at a predesignated location. Deviation from either the predesignated orientation or location may result in the automated device not engaging the workpiece and inserting it into the production line component.

Many of the workpieces or parts used in such automated production lines are delicate in nature because they are stamped and formed from thin sheet metal prior to being presented to an automated assembly device. The stamping and forming if the workpiece typically occurs away from the automated production line. The finished workpieces must be presented to the robotic assembler in a particular fashion. Any robotic assemblers utilize "carrier strips" or "carrier tapes" to feed parts to them. One such type of carrier tape is known as "debossed tape and reel" and consists of a plastic carrier tape with a plurality of recessed pockets or openings formed therein along the longitudinal extent of the tape. A part is placed in each of the pockets and a plastic sealing tape or bonding tape is adhesively applied to the carrier tape, thereby sealing the parts in their respective pockets. The carrier tape is fed into a robotic assembler and the seal tape is peeled away and the part removed and installed. Both the seal tape and the carrier tape are then discharged to waste by the robot. Examples of such constructions are described in U.S. Pat. Nos. 4,712,675 and 4,781,953. However, human insertion of the parts into the pockets is often required and the two-part nature of the debossed tape is expensive. Additionally, a specific orientation of the parts in the pocket must also be maintained for pick-up by the robot loader.

Another type of carrier type is known by the tradename of "GPAX" and is described in U.S. Pat. Nos. 4,583,641 and 4,757,895. In a GPAX-type structure, a carrier type is provided with a plurality of holes and intervening slots punched into it for its longitudinal extent. The holes are adapted to engage legs or stubs of each electrical part to insure proper and secure positioning of the part on the tape. A plastic bonding tape overlays the carrier tape and parts and is pressed or stitched into the carrier tape between adjacent parts. This bonding tape offers protection to the parts and retains the parts in place on the carrier tape. This type of carrier tape construction shares certain disadvantages with the debossed tape and reel construction previously described. For example, the assembled tapes are composed of multiple pieces and thus increases the amount of waste generated by the process. Neither of these constructions include or even suggest a carrier type or supply feedstock which is created during the forming of the parts contained within the carrier tape.

In both of these styles of feedstocks, the parts are formed and trimmed from a supply feedstock at a location distant from the robotic loader or assembler. Conventional trimming machines trim parts from a supply feedstock, but do not contain any means to receive the part after trimming and present to an automated loading or assembly device within the feedpath of the trimming machine. No machines are known which both trim a workpiece from a supply feedstock and present the separated workpiece to a predesignated location for pick-up by an automated loading or assembly means.

The present invention is directed to a workpiece finishing and presentation machine which overcomes the aforementioned disadvantages and provides benefits not obtainable with the aforementioned constructions. In accordance with the principles of the present invention, a finishing and presentation machine is provided which is intended for use with a supply feedstock having the form of a succession of individual workpieces interconnected by web portions extending between the workpieces along the length of the feedstock. The machine includes a means for feeding the supply feedstock by engaging the web portions thereof to a trimming means to separate an individual workpiece from the feedstock supply coil. During separation, the individual workpiece is urged into a nest whereupon it contacts a part positioning means. After trimming, the part positioning means withdraws the workpiece from the trimming means and moves it to a predesignated location and presents it at a predesignated elevation for engagement by a robotic loader or assembly device. The amount of waste generated by such a finishing and presentation machine is substantially reduced as compared to a conventional trimming machine which feeds parts thereto by way of continuous elongated marginal control strips.

In one principal aspect of the present invention, the trimming means includes a reciprocating die disposed within a trimming means which accommodates the workpiece and its interconnecting web portions. The trimming means includes a nest located adjacent the workpiece, which nest accommodates a part positioning means in the form of a reciprocating horn which enters the nest prior to the trimming step and securely engages the workpiece when it is separated from the supply coil and interconnecting web portions. The workpiece is thereupon removed from the trimming means by the part positioning means and is further moved into a predesignated location where the part positioning horn advances to a predesignated pick-up location. A robotic loader or assembler subsequently removes the workpiece from the horn.

In another principal aspect of the present invention, the finishing and presentation machine includes a feedpath having a channel adapted to receive the passage of an individual workpiece therethrough, the channel having shoulder portions which receive the web portions interconnecting successive workpieces.

In yet another principal aspect of the present invention, the part positioning means includes a reciprocatable carriage assembly which reciprocates between first and second operative positions along a part conveyance path wherein in the first operative position, the part positioning means is positioned adjacent to the part trimming means and wherein in the second operative position, the positioning means is advanced away from the trimming means into a predesignated automated assembly device pick-up or engagement location. The part positioning means further includes a reciprocating horn which reciprocates between two elevations, one elevation being where the horn either engages a workpiece while being trimmed or presents the trimmed workpiece to an automated loading device and the second elevation being where the horn is retracted and enters or exits the trimming means.

Accordingly, it is an object of the present invention to provide an improved workpiece finishing and presentation machine which sequentially trims individual workpieces from a supply feedstock and presents the separated workpiece to a robotic loader or assembler.

Another object of the present invention is to provide a workpiece finishing and presentation machine wherein the machine includes means for mounting a supply of interconnected workpieces in the form of a supply bandolier or continuous belt, means for engaging and feeding the continuous feedstock, means for trimming individual workpieces from the continuous belt and means for receiving an individual workpiece so trimmed from the feedstock and presenting same to a robotic loader or assembler.

Yet another object of the present invention is to provide a workpiece finishing and presentation machine adapted to receive a supply feedstock of individual workpieces range in the form of a continuous bandolier or belt of workpieces arranged in side-by-side order, the workpieces being interconnected by web portions extending between adjacent workpieces, the machine having means for feeding the supply feedstock for engaging the web portions thereof to a trimming means which trims the web portions and discharges them to waste, the machine further having a workpiece presentation means with a defined automated assembler presentation surface which engages a presentation surface associated with each workpiece, the presentation surface partially defining an engagement space adapted to engage a reciprocating member of the presentation means.

Still another object of the present invention is to provide a workpiece trimming and presenting machine which trims a single part from a continuous, supply means of interconnected parts and presents each separate part to an automated assembly means wherein the machine includes a plurality of supply means condition sensing means to detect conditions of the feedstock and take appropriate action based upon such conditions.

These and other features and objects of the present invention will become apparent from a reading of the following detailed description.

BRIEF DESCRIPTION OF THE DRAWINGS

In the course of the following detailed description, reference will be made to the attached drawings wherein like reference numerals identify like parts and wherein:

FIGS. 5A–C are three cross-sectional views of the cutting cylinder taken along lines 5—5 of FIG. 2 showing the trimming cycle of the machine, and in serial order showing the cutting punch in a open position, a closed, ready position ready to trim the workpiece and a closed, cutting position wherein the workpiece is trimmed from the supply feedstock;

DETAILED DESCRIPTION OF THE INVENTION

Figure 1:
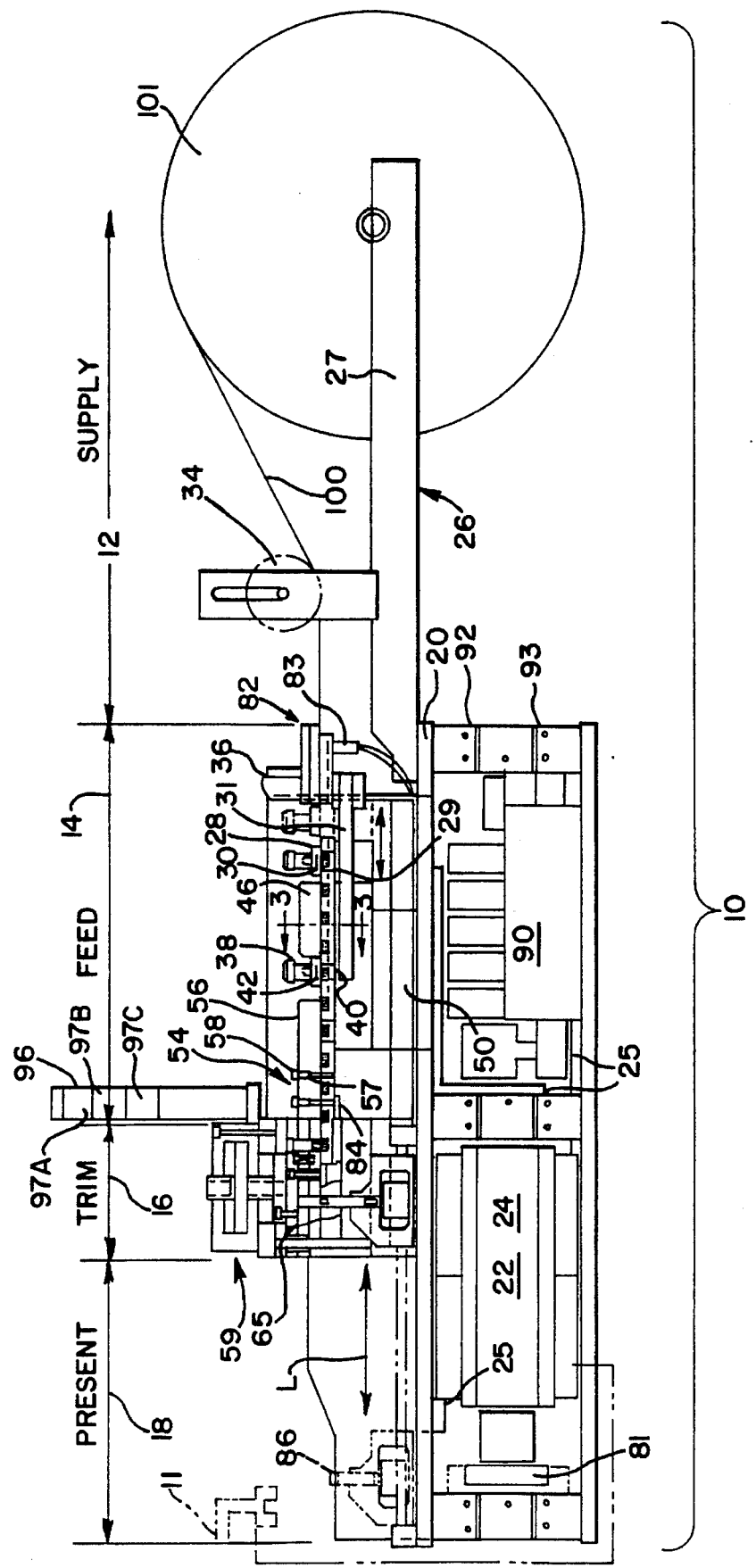
FIG. 1 is an elevational view of a workpiece finishing and presentation machine constructed in accordance with the principles of the present invention.

FIG. 1 illustrates a workpiece and presentation machine 10 constructed in accordance with the principles of the present invention. The machine 10 includes a number of separate action areas: a supply area 12, a feed area 14, a trim area 16 and a workpiece presentation area 18. The machine 10 includes an elongated frame 20 which supports the various structural and operative components of the machine. A base portion 50 of the machine 10 is supported by the frame 20 and extends between the form area 14 and the feed area 12.

Turning now to the supply area 12, the frame 20 includes a supply mounting member 26 shown as elongated arms 27 which extend cut from the frame 20 and include a means for mounting a supply reel 101 of feedstock 100. In order to prevent the feedstock supply 100 from unwinding excessively on the reel 101, the mounting member 26 may include a tensioning roller 34 which provides a point of contact to the feedstock 100.

The machine frame 20 preferably contains a suitable control means 22 to monitor the various operations of the machine. A suitable controller may be a programmable numeric controller 24 of the type that receives multiple input signals and generates specific outputs in response to the input signals according to a predetermined program. The controller is suitably connected to the various operational elements of the machine, as well as to the automated assembler 11, such as by leads 25.

Figure 2:
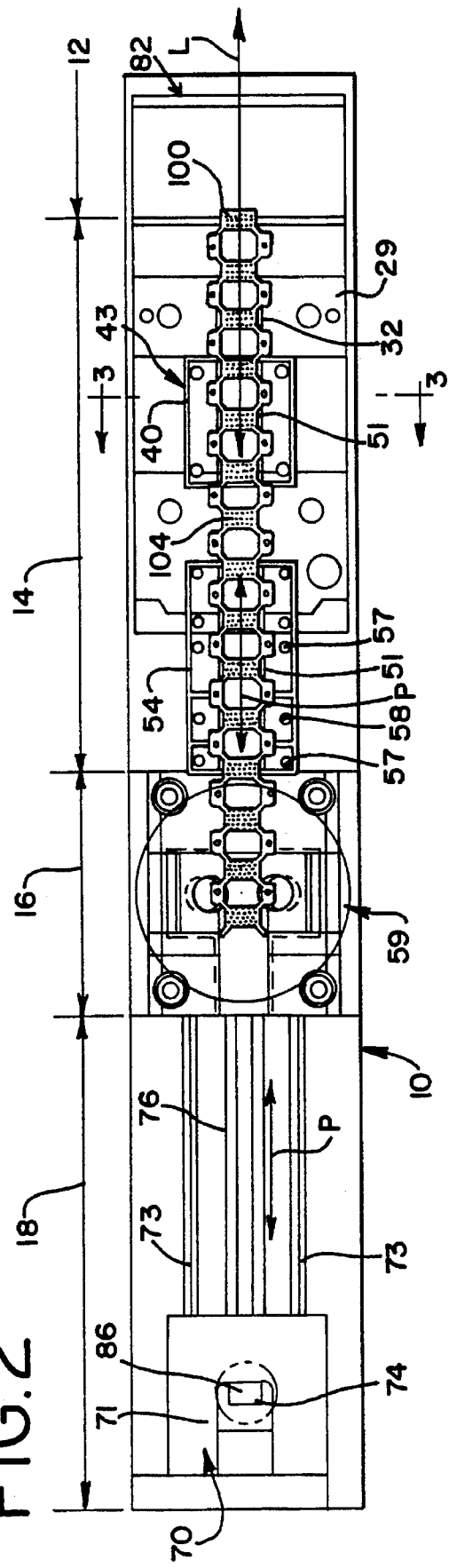
FIG. 2 is a plan view of the machine of FIG. 1 with a portion of the cutting cylinder removed for clarity.
Figure 4:
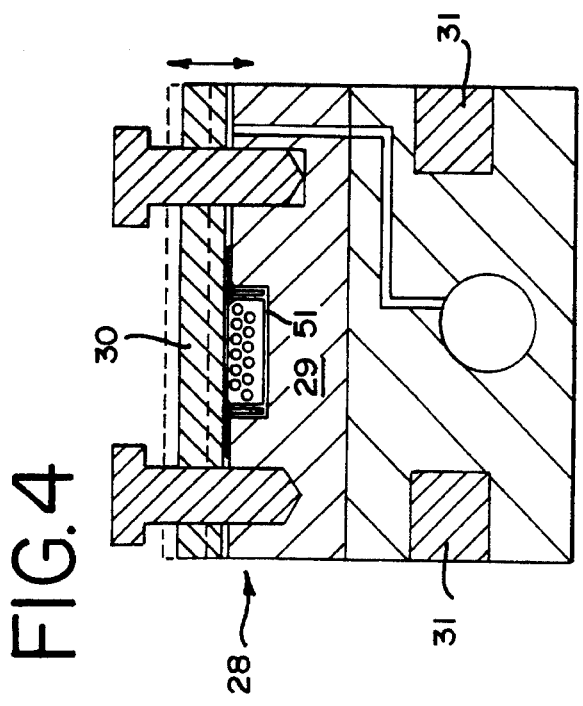
FIG. 4 is a cross-sectional view taken along lines 4—4 of FIG. 1 showing the feed clamp mechanism of the machine which advances the supply feedstock through the machine.
Figure 8:
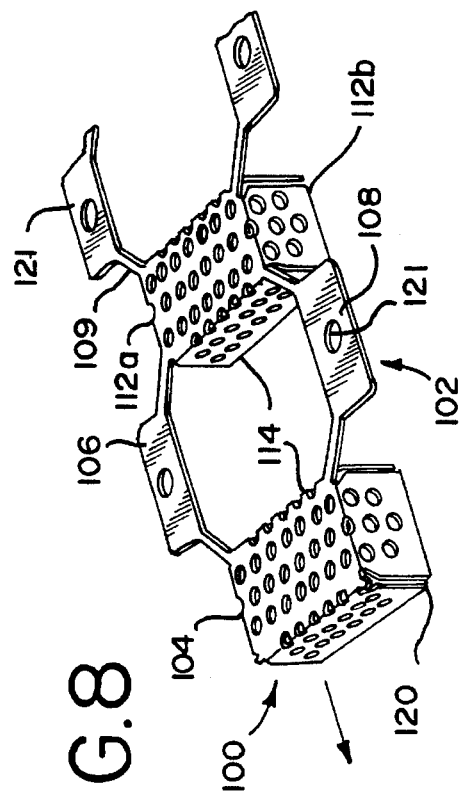

Adjacent the supply area 12 is the feed area 14, wherein the machine includes various means for advancing the feedstock 100 to the trim area 16 along the feedpath P. (FIG. 2.) A pneumatically operated feed clamp 28 is attached to a slider mechanism 31 which reciprocates along the longitudinal axis L of both the machine 10 and the feedstock 100. The feed clamp 28 includes a base component 29 and a movable cover component 30 which reciprocates up and down upon a signal from the controller 24. The base component 29 of the feed clamp 28 has a channel 51 defined therein which receives the workpieces 104 of the feedstock 100 in serial order. (FIG. 4.) As explained below and as illustrated in FIGS. 2 and 8, the feedstock 100 comprises individual workpieces 104 interconnected by intervening webs 106 having planar portions 108, and therefore the webs 106 provide points of engagement for the feed clamp 28. The webs 106 are gripped by the clamp base and cover components 29, 30 when the feed clamp 28 is activated and enclosed so that as the feed clamp 28 moves forwardly along the feedpath P, the feedstock 100 is advanced.

The feed clamp 28 moves forward in its feedstock advancement stroke, and the base and cover components 29, 30 then separate and the feed clamp 28 retracts to its start position adjacent a machine feedstock first sensor 83 which is connected in a conventional manner to the controller 24 and which sends a signal to the controller 24 when the feedstock 100 is misfed along the feedpath P.

Figure 3:
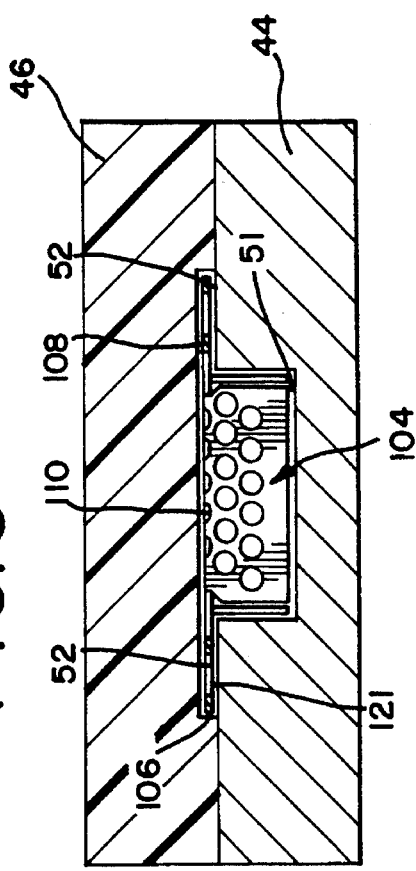
FIG. 3 is a cross sectional view taken along lines 3—3 of FIG. 1 showing a portion of the feedpath in the machine which receives the supply feedstock as it advances through the machine.

A second clamp 38 is located forwardly of feed clamp 28 and is stationary relative to the feed clamp 28. It also comprises a base component 40 and a reciprocatable cover plate 42. This clamp 38 serves to hold the feedstock 100 in place during the trimming cycle of the machine 10. Interspersed between the two clamps 28, 30 is a means 43 to prevent the buckling of the feedstock 100 during operation of the machine. This anti-buckling means 43 comprises a base 44 and a stationary cover plate 46. (FIG. 3.) A clear plexiglass material is one preferred material of construction for the cover plate component 46 in that it enables the operator of the machine 10 to monitor the advancement of the feedstock 100. The clamps 28,38 and anti-buckling means 43 all rely upon engagement with the intervening webs 106 of the feedstock 100.

The base 50 of the machine 10 has a channel 51 extending along the longitudinal axis L of the machine which defines a feedstock feedpath P of the machine 10. The channel 51 may have opposing shoulder portions 52 communicating therewith such that while the channel 51 accommodates the workpiece 104, the shoulder portions 52 accommodate the interconnecting webs 106 of the feedstock 100, or any other means for interconnecting the workpieces together.

A feedstock registration station 54 is disposed forward of the second clamp 38, and includes a stationary cover plate 56, similar in construction to the cover plate 46 of the anti-buckling means 43, but which differs therefrom in that it has a plurality of openings 57 arranged therein. These registration openings 57 extend completely through the cover plate 56 and accommodate a pair of spring-biased registration pins 58 which are used to positively position the feedstock 100 at the required spacing for proper feeding to the trim area 16. These pins 58 engage complimentary openings 121 formed in the webs 106 of the feedstock 100. To begin operation of the machine 10, an operator advances the feedstock 100 to the registration station 54 and engages the registration pins 58 with the feedstock web openings 121. The machine 10 is then energized and the pins 58 are sprung out of their openings 121 and the feed clamp 28 subsequently begins advancing the feedstock 100.

As shown in the drawings, a trim area 16 is located adjacent the registration station 54 and comprises a cutting cylinder 59 which has a reciprocating cutting punch 60 disposed therein which trims individual workpieces 104 from their interconnecting webs 106 of the feedstock 100. As best illustrated in FIGS. 5A–5C, the cutting punch 60 includes a cutting head 62 having multiple die inserts 63 and similar opposing die inserts 64 held in a yoke 61, both sets of inserts 63, 64 being configured at least partially complementary to the configuration of the workpiece 104 to trim the workpiece 104 from its associated webs 106.

In an important aspect of the present invention, the cutting cylinder 59 includes a cavity 65 formed therein which is aligned proximate to the position of the workpiece 104 within the cutting cylinder 59. The cavity 65 is large enough to accommodate the entry therein of a workpiece positioning means 70 which reciprocates in travel along the axis L of the machine. The cavity 65 further preferably includes an integral portion thereof, such as extension 66 extending upwardly from the cavity 65 within the cutting cylinder 59 and communicating with the cutting punch 60. The cavity 65 and extension 66 cooperate to define a nest 67 into which the workpiece positioning means 70 enters and exits during machine operation. In this regard, the controller 24, by way of leads 25 is connected to the workpiece positioning means 70 and controls the movement of the positioning means 70 along its travel path in and out of the cutting cylinder 59.

FIGS. 5A–5C depict the trim cycle of the machine 10 in serial order in which FIG. 5A illustrates the cutting punch 60 in a open position, FIG. 5B illustrates the cutting punch 60 in a closed, ready position where it has contacted the workpiece 104 and is ready to trim same from the supply feedstock 100 and FIG. 5C illustrates the cutting punch 60 in a closed, cutting position wherein the die inserts 63, 64 trim the workpiece from the supply feedstock 100 and where the webs 106 are discharged to waste via through suitable disposal channels 69.

As shown in these Figures, the workpiece positioning means 70 enters the cavity 65 of the cutting cylinder 59 and stops when aligned with the cavity extension 66 and cutting head 62. The workpiece horn 74 reciprocates vertically as part of the workpiece positioning means 70 within the cavity 65 and extension 66 to engage a workpiece 104 separated from the feedstock 100. When the positioning means 70 is in place within the cavity 65 as shown in FIG. 5B, the cutting head 62 advances toward the lower die inserts 64 and contacts the workpiece 104 and its associated webs 106. The cutting head 62 continues to travel and shears the webs 106 off of the workpiece 104 to thereby separate same from the feedstock 100. In this step, the positioning horn 74 has previously moved upwardly within the nest 66 to engage the workpiece engagement surface 110 and the engagement space 120 defined therein while the cutting head 62 advances downwardly.

Figure 6:
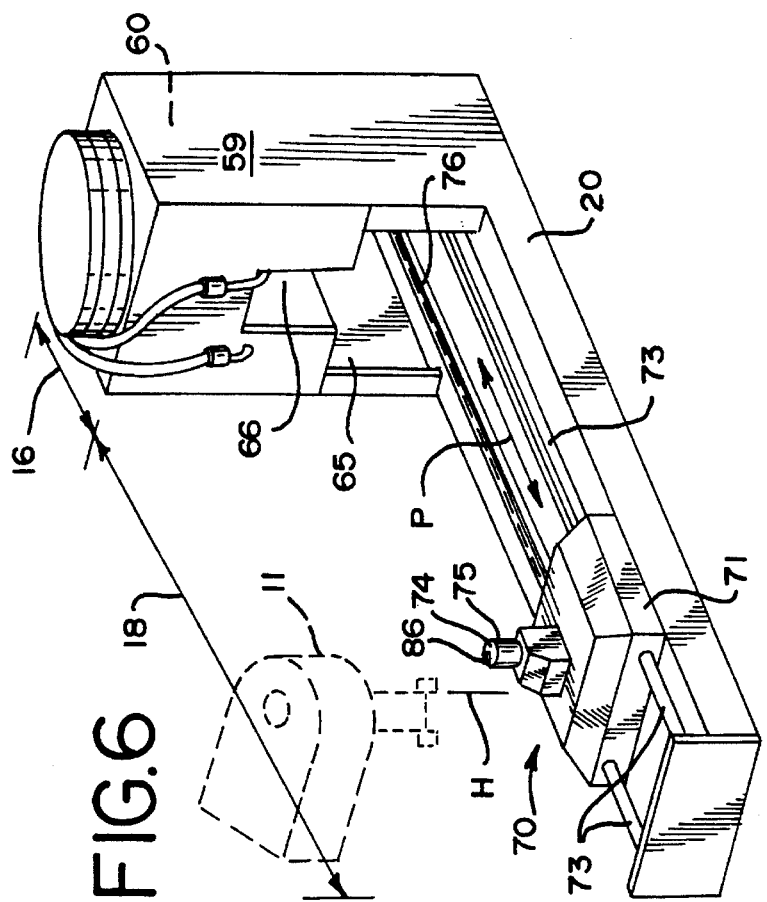
FIG. 6 is a partial perspective view of the machine of FIG. 1 showing the presentation area and in particular, the part positioning means.

With more specific reference to FIG. 6, the workpiece positioning means 70 includes a carriage assembly 71 which engages elongated tracks 73 disposed upon the machine frame 20 extending along the feedpath P. The carriage assembly 71 is pneumatically operated and air is supplied thereto by way of flexible piping 76. The horn 74 is also pneumatically driven between its two elevations preferably by air supplied to the carriage assembly 71.

The carriage assembly 71 reciprocates between two operative positions. One such position is where the workpiece positioning means 70 is within the cutting cylinder 59. The other operative position is where the workpiece 104 is withdrawn from the cutting cylinder 59 and is presented to a robotic loader or assembler 11, shown in phantom, wherein the horn 74 is again extended to an elevation suitable for engagement by the robotic loader 11. Although the travel path of the workpiece positioning means 70 is shown in the drawings as linear, it will be understood that dependent on the configuration of the rails 73, the travel path may also be curved or another configuration.

The horn 74 passes freely in and out of the cutting cylinder cavity 65 between a presentation, or receiving position wherein the horn 74 is extended vertically to receive either a workpiece 104 separated from the feedstock 100 within the cutting cylinder 59 or to present a workpiece 104 to a robotic loader or assembler 11. The extent of this travel is depicted by the arrows H in FIG. 6.

Figure 7:
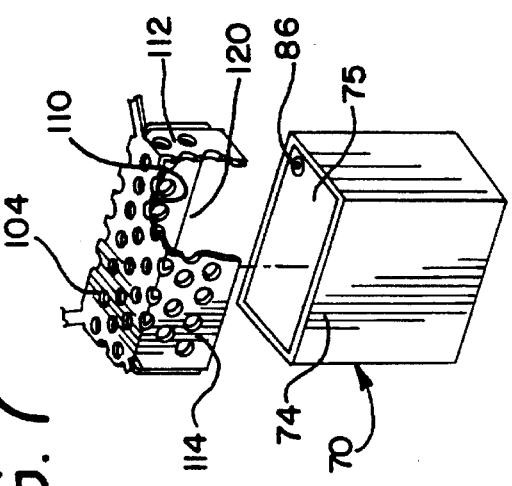
FIG. 7 is an exploded perspective view, partially in section of the part positioning means and an individual workpiece; and, FIG. 8 is a perspective view of a supply feedstock adapted for use in the present invention.

Turning now to FIGS. 7 & 8, a feedstock 100 of the type intended for use in the finishing and presentation machine 10 of the present invention is illustrated. The feedstock 100 typically takes the form of a continuous belt or bandolier 102 having a plurality of individual workpieces 104 disposed adjacent each other in a side-by-side relationship. The workpieces 104 are interconnected and governed in a predetermined spacing apart from each other by a plurality of webs 106 which extend between adjacent workpieces for the entire length of the feedstock 100 in the manner shown. The webs 106 include a generally planar portion 108 which may be disposed in a common plane with a presentation engagement surface of each workpiece 104 or they may lie in a plane spaced apart from the workpiece engagement surface 110. Preferably, the webs 106 occupy a common plane for the entire length of the feedstock 100.

The webs 106 may further include leg or stem portions 109 which extend from the planar portions to adjacent workpieces 14. The webs 106 interconnect opposing ends or head and tail portions, respectively 112A, 112B of each of the workpieces 104 and serves to maintain the workpieces 104 in their predetermined spacing which is preferably tailored to the engagement components of the machine 10, such as clamps 28 & 38 and cutting cylinder 59.

The structure of the feedstock 100 is the subject of a copending patent application, entitled "Supply Feedstock For Workpiece Finishing Machine", Ser. No. 08/123,712, filed simultaneously herewith. The disclosure of that application is hereby incorporated in reference. As described in the specification of that application, each workpiece 104 of the feedstock 100 preferably includes a presentation surface 110 which may or may not have multiple edges 112,114 extending around the perimeter of the presentation surface 110. In instances where such multiple edges 112, 114 are present, these edges cooperate to define an engagement space or pocket 120 of each workpiece 104 which is adapted to receive the horn 74 of the workpiece positioning means 70. The feedstock 100 is preferably formed from a thin gauge sheet metal and the interconnecting webs thereof, preferably lay exterior to the edges 112 of the workpiece.

In order to monitor the progress of the feedstock 100 as it advances through the machine 10, the machine is provided with a plurality of sensors, preferably fiber-optic sensors. These sensors are interconnected to the controller 24 by way of a fiber optic network 81. The first such sensor is mounted at the forward end 82 of the machine. The first sensor 83 detects a misfeed of the feedstock 100. A second sensor 84 is mounted forwardly of the first sensor 83 and by way of a fiber optic cable or other photosensitive device determines the end of the feedstock roll. A third sensor 86 is located within the workpiece receiving horn 74 and is located within a defined presentation surface 75 thereof. This sensor determines the presence or absence of a workpiece on the horn for the robotic loader or assembler. In that regard, the horn 74 is specially configured to the particular workpiece 104 presented within the supply feedstock 100. An air manifold 90 is located within the frame 20 of the machine 10 and includes a plurality of inlets and outlets 92, 93 for attachment to pneumatic piping. The air is regulated by the controller in accordance with a program written from the specific part of the specific workpiece. The machine 10 may further include a visual indicia means in the form of a light tower 96 extending upwardly from the machine 10 having a plurality of lights 97A, 97B, 97C disposed thereon which are of different colors indicating the existence of predetermined conditions within the machine.

Certain advantages and benefits are achieved by the present invention such as reducing the need to separate individual workpieces from a supply feedstock at a location far from the assembly line.

It will be seen that while certain embodiments of the present invention have been shown and described, it would be obvious to those skilled in the art that changes and modifications may be made therein without departing from the true spirit and scope of the invention.

I claim:

1. A workpiece finishing and presentation machine for separating a workpiece from a supply of individual workpieces interconnected together and presenting the workpiece to an automated loading means, the supply of workpieces being in the form of a continuous supply belt of individual workpieces arranged along a longitudinal axis and interconnected by integral web portions, the integral web portions defining opposing, longitudinal edges of the supply belt, said workpieces being further disposed within said supply belt edges and interior of said web portions, each of said workpieces further including a machine engagement surface, the machine comprising:

means for feeding said supply belt to a first location within said machine, means disposed at said first location for successively separating individual workpieces from said supply belt of interconnected workpieces, the separating means including a nest which successively receives individual workpieces of said supply belt, means for presenting a separated workpiece to the automated loading means, said automated loading means being disposed at a second location of said machine remote from said first location, the workpiece presenting means including an engagement member operable between first and second operative positions, wherein, in said first operative position, said workpiece presenting means enters said separating means and receives the workpiece separated from said supply belt and wherein said workpiece presenting means exits said separating means and moves to said second operative position, said second operative position being a predesignated position at said second location whereby, said separated workpiece is engaged by said automated loading means, the machine further including a supply belt feedpath extending between said feeding means and said separating means, said supply belt feedpath including a channel portion having a depth sufficient to receive individual workpieces of said supply belt therein as said supply belt is fed by said feeding means to said workpiece separating means, said supply belt feedpath further including support surfaces adjacent the channel portion which support only said web portions of said supply belt, said feedpath being aligned with and communicating with said separating means nest, said feeding means including at least one clamping member slidably disposed along said supply belt feedpath which incrementally feeds said feed supply toward said separating means by clamping and advancing said supply belt, said clamping member including a channel also having a depth sufficient to receive said supply belt workpieces therein the clamping member further having shoulder portions disposed adjacent said channel which engage only said web portions of said supply belt during feeding of said supply belt by said feeding means.

2. The finishing machine of claim 1, wherein said separating means includes a cutting punch and said presenting means includes a vertically reciprocating horn, the horn having a workpiece engagement surface which successively engages the machine engagement surface of said workpiece, said horn including a carriage slidable between said first and second operative positions.

3. The finishing machine of claim 2, wherein each of said workpieces includes at least two walls which cooperate with said workpiece machine engagement surface to define an engagement space into which said horn extends in order to support said workpiece while said workpiece is separated from said supply belt by said separating means.

4. The finishing and presentation machine of claim 1, further including means for sensing the presence of a workpiece in said feeding means and in said workpiece presenting means.

5. The finishing machine of claim 1, wherein said clamping member shoulder portions and said workpiece machine engagement surfaces are generally coplanar.

6. The finishing machine of claim 1, wherein said feeding means further includes a second clamping member disposed along said feedpath and spaced apart from said one clamping member, said second clamping member also having a channel which receives said supply belt workpieces therein, the second clamping member having shoulder portions adjacent said channel which engage only said web portions of said supply belt during separation of a workpiece from said supply belt.

7. The finishing machine of claim 1, further including means for indexing said supply belt with respect to said separating means, the indexing means including at least one registration member disposed proximate to said supply belt feedpath the registration member engaging only said supply belt web portions.

8. A finishing and presentation machine for separating a single workpiece from a supply of interconnected workpieces and presenting the separated workpiece to an automated loading means, the workpiece supply having the form of a continuous belt of individual workpieces interconnected by integral webs, the webs being disposed in a common plane along the length of the belt, said webs further defining two opposing longitudinal edges of said belt, said workpieces being disposed within said belt interior of said webs, the machine comprising, means for separating an individual workpiece from said belt;

means for advancing said workpiece supply to said separating means, the workpiece advancing means including first and second clamps spaced apart from each other along a longitudinal axis of said machine, said first and second clamps each having opposing cover and base portions, the clamp cover portions being capable of vertical reciprocating movement with respect to said clamp base portions, the clamp base portions having longitudinal passages formed therein which define protective channels which receive said workpieces therein as said belt is clamped by said clamps during operation of said machine, said clamp base portions further having belt engagement portions disposed thereon generally adjacent to the protective channels, the belt engagement portions supporting only said belt webs and not said belt workpieces, such that when said clamp cover portions are bought into clamping contact with said clamp base portions, said clamp cover and base portions cooperate to engage only said belt webs and not said workpieces, said first clamp being fixed in position on said machine and said second clamp being spaced apart from said first clamp and further being reciprocatable along said longitudinal axis of said machine; and, means for presenting said individual workpiece to a predesignated location for engagement by said automated loading means.

9. The finishing and presentation machine of claim 8, wherein said separating means includes a cutting cylinder having a cutting element reciprocatably mounted therein, the cutting cylinder further including a cavity disposed in alignment with the cutting element, the cutting cylinder cavity further being aligned with at least one of said first and second clamp protective channels, said cavity accommodating entrance and exit of said presenting means.

10. The finishing and presentation machine of claim 9, further including a programmable control means in communication with said separating means and said presenting means, whereby movement of said separating means is synchronized with movement of said presenting means.

11. The finishing and presentation machine of claim 9, wherein said presenting means includes an extendable workpiece engagement member mounted on carriage means, the carriage means being movable between said cutting cylinder cavity and said predesignated presentment location, the workpiece engagement member being extendable between two positions, a first of said two positions permitting said engagement by said member of said individual workpiece and a second of said two positions permitting movement of said presenting means in and out of said separating means.

12. The finishing and presentation machine of claim 8, wherein said separating means cuts said individual workpiece from said webs of said belt and further includes means for discharging said webs to waste after separation of said workpiece.

13. A machine for trimming a single part from a supply of individual parts and presenting the single part to an automated loading means at a predetermined location and elevation, the machine being adapted to engage a supply of parts in the form of a continuous supply belt of parts in which individual parts are disposed side-by-side in a predetermined spacing with adjacent parts being interconnected together by integral web portions at opposing ends of said parts, the web portions being disposed generally flat in a common plane, said machine comprising: means defining a feedpath of said machine extending along an axis of said machine, the feedpath having a part-receiving channel and supply belt supporting surfaces, means for cutting a single part from said supply belt of parts, means for advancing said supply of parts along said feedpath by engaging only said web portions of said supply belt so as to incrementally advance successive interconnected parts in the plane of said web portions into a ready position within said cutting means and means for receiving said single part cut from said supply belt and presenting it to a predetermined location and elevation distant from said cutting means.

14. The machine of claim 13, wherein said part advancement means includes a first clamp member disposed along said feedpath and slidable along said feedpath, the first clamp member having a part-receiving channel aligned with said feed path part-receiving channel, and at least one web portion engagement surface which engages only said web portions of said part supply belt and advances said part supply belt incrementally upon receipt of a signal from a programmable control means.

15. The machine of claim 14, further including a second clamp member disposed along said feedpath spaced apart from said first clamp member, said second clamp member engaging said parat supply during cutting operation of said cutting means.

16. The machine of claim 13, wherein said cutting means includes a cutting punch operatively associated with at least one die insert, said machine further including means associated with said cutting means defining a nest aligned with said cutting punch and further aligned with said feedpath, the nest permitting movement of said part receiving and presenting means into and out of alignment with said cutting punch, said cutting punch further including means for supporting said supply belt in said plane of said web portions and not supporting said parts during cutting.

17. The machine of claim 16, wherein said part receiving and presenting means includes a reciprocatable part engagement horn capable of reciprocating elevational movement between predetermined elevations and carriage means capable of translational movement between said cutting means and a predetermined location.

18. The machine of claim 13, wherein said cutting means includes removal means operatively associated with said cutting means for transmitting to waste said supply belt web portions which have been severed from an individual part.

19. The machine of claim 13, further including a programmable control means for controlling operation of said advancing means, cutting means and said part receiving and presenting means relative to one another, said control means having means for receiving input signals from said advancing means, cutting means and said part receiving and presenting means and means for generating output signals to said advancing means, cutting means and said part receiving and presenting means.

20. The machine of claim 13, further including a plurality of sensors operatively associated with said advancement means and said part receiving and presenting means to determine the presence of said part supply within said machine.

21. The machine of claim 13, further including means for indexing said supply belt of parts with respect to said cutting means, the indexing means being disposed in opposition to said feedpath supply belt supporting surfaces and including at least one registration member which intermittently engages a portion of a supply belt web portion.

22. An apparatus for successively trimming individual workpieces from a supply of interconnected workpieces in the form of a continuous supply belt of workpieces in which the workpieces are disposed side-by-side in a spaced-apart order along a longitudinal axis of the supply belt and interconnected together with each other by integral web portions at opposing ends of said workpieces, the web portions extending between adjacent workpieces and further defining two opposing, longitudinal edges of said supply belt, each of said workpieces having a perimeter which is disposed interior of the supply belt edges and interior of said web portions, the apparatus comprising: a base; a feedpath defined in the base extending along a longitudinal axis of said machine, the feedpath including a channel aligned with the machine longitudinal axis, the feedpath channel receiving said workpieces, said feedpath further including support surfaces associated with said channel which supportingly engage said supply belt web portions; means for trimming an individual workpiece from said supply belt means for feeding said supply belt incrementally along said feedpath to the trimming means, by clampingly engaging only said supply belt web portions, said feeding means including a reciprocating clamping member having a protective channel portion having a depth sufficient to receive said workpieces therein during clamping, the clamping member further having shoulder portions adjacent to and communicating with said clamping member channel portion, the clamping member shoulder portions providing support surfaces against which only said supply belt web portions are clamped by said clamping member; means defining a nest aligned with said trimming means, the nest receiving said workpiece after trimming from said workpiece supply; and, workpiece engagement and presentment means, the workpiece engagement and presentment means being movable between at least two preselected elevations and being further movable along a preselected presentment path between at least two preselected locations, said workpiece engagement and presentment means entering said nest during trimming of said workpiece and subsequently exiting said nest after trimming.

* * * * *

UNITED STATES PATENT AND TRADEMARK OFFICE
CERTIFICATE OF CORRECTION

PATENT NO. : 5,483,857

DATED : January 16, 1996

INVENTOR(S) : Frank Ziberna

It is certified that error appears in the above-indentified patent and that said Letters Patent is hereby corrected as shown below:

```
Column 1, line 56, "if" should read --of--.
Column 1, line 59, "Any" should read --Many--.
Column 7, line 38, "14" should read --104--.
Column 7, line 47, "08/123,712" should read --08/123,717--.
Column 11, line 12, "feed path" should read --feedpath--.
Column 11, line 20, "parat" should read --part--.
Column 12, line 29, after belt insert --,--.
```

Signed and Sealed this

Thirtieth Day of April, 1996

Attest:

BRUCE LEHMAN

*Attesting Officer*    *Commissioner of Patents and Trademarks*